US007902939B2

(12) United States Patent
Blair

(10) Patent No.: US 7,902,939 B2
(45) Date of Patent: Mar. 8, 2011

(54) STRIPLINE BALUN

(75) Inventor: Cynthia Blair, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 202 days.

(21) Appl. No.: 12/253,323

(22) Filed: Oct. 17, 2008

(65) Prior Publication Data

US 2010/0097155 A1 Apr. 22, 2010

(51) Int. Cl.
*H03H 7/42* (2006.01)
*H01P 3/08* (2006.01)

(52) U.S. Cl. ........................................... 333/26; 333/238

(58) Field of Classification Search .................... 333/25, 333/26, 238, 246; 455/326
See application file for complete search history.

(56) References Cited

U.S. PATENT DOCUMENTS 4,947,062 A * 8/1990 Weiner et al. ................ 327/113
5,451,914 A * 9/1995 Stengel ........................... 333/25
6,614,325 B1 9/2003 Kocin
6,807,407 B2 * 10/2004 Ji .................................. 455/326
6,959,180 B2 * 10/2005 Ji .................................. 455/333
7,027,795 B2 * 4/2006 Ji .................................. 455/333
7,495,525 B2 * 2/2009 Ilkov et al. ...................... 333/26
7,580,693 B2 * 8/2009 Rohde et al. ................. 455/326

OTHER PUBLICATIONS

Melais, S. E. et al. "A Low-Profile Broadband Strip-Line Balun." 2005 IEEE Antennas and Propagation Society International Symposium, vol. 3B, Jul. 3-8, 2005, pp. 369-372. Also available at: http://ee.eng.usf.edu/WAMI/resources/ads-software/ads-2/APS05_Melais.pdf.

* cited by examiner

*Primary Examiner* — Dean O Takaoka
(74) *Attorney, Agent, or Firm* — Coats & Bennett, P.L.L.C.

(57) ABSTRACT

According to one embodiment, a balun includes one or more transformers configured to block DC power between a line and a device at microwave frequencies. The one or more transformers block DC power between the line and the device by electromagnetically coupling the device to the line.

28 Claims, 7 Drawing Sheets

STRIPLINE BALUN

BACKGROUND

Baluns convert between balanced and unbalanced electrical signals and can also provide impedance transformation. Baluns are widely used to couple power transistors such as push-pull or switched power transistors to a single-ended (i.e., unbalanced) 50Ω environment such as a coaxial cable. The balun converts between the balanced output of the power transistor and the unbalanced output line and matches the relatively low drain impedance of the power transistor to the relatively high impedance of the single-ended load. A greater impedance transformation ratio can be realized by coupling two transformers together. Typically, one or both of the transformers include a discrete wire-wound structure such as a coaxial cable wound around a guide or a conductive microstrip structure printed onto a single layer of a PCB (printed circuit board). One transformer is coupled to a single-ended output line while the other transformer is coupled to the power transistor drain. The transformers are conventionally capacitively coupled to the drain of the device by one or more DC blocking capacitors. A similar balun arrangement is used at the input (gate) side of the power transistor. As such, the input and output of the power transistor are capacitively coupled to respective single-ended input and output lines through multistage baluns. The DC blocking capacitors of each balun tend to be small in size. At high power levels (e.g., 300 W or greater), significant heating occurs. Excessively high temperatures destroy DC blocking capacitors, limiting the usefulness of conventional multistage baluns to power applications of about 300 W or less.

Most circuits using conventional multistage baluns also typically have a single-sided DC feed path to the drain of the power transistor. In many applications, the drain of a power transistor has a relatively wide trace so that the drain is low impedance (e.g., 10Ω or less). Providing DC power to the drain of a power transistor through a single-sided DC feed path causes both sides of the drain to be terminated at different electrical lengths, e.g., ¼ at the DC feed path side and ½ at the other side. Single-sided DC feed structures cause unequal terminating impedances and/or high inductance feeding, both of which adversely affect transistor operation. A high inductance feed path to the drain of a power transistor is particularly problematic for high bandwidth applications such as COFDM (coded orthogonal frequency-division multiplexing) video where signal power levels rapidly rise and fall. Under these signal switching conditions, a high inductance feed can cause repetitive L di/dt avalanche breakdown conditions to occur in the power transistor.

It is known to use a single broadside-coupled stripline structure as a transformer in a power amplifier device. A broadside-coupled stripline structure typically includes two ground planes between which one stripline conductor is spaced apart and electromagnetically coupled to a second stripline conductor. However, the single broadside-coupled stripline transformer is still capacitively coupled to a wire-wound transformer or a transformer microstrip structure to complete the impedance matching and balun structure. This type of structure is still prone to excessive DC blocking capacitor heating at high power conditions as explained above, and thus is limited to lower power applications. This type of multistage balun also uses a single-sided path to feed DC power to the drain of a power transistor, causing unequal terminating impedances and/or high inductance feeding.

SUMMARY

According to an embodiment, a balun includes one or more transformers configured to block DC power between a line and a device at microwave frequencies. The one or more transformers block DC power between the line and the device by electromagnetically coupling the device to the line.

Those skilled in the art will recognize additional features and advantages upon reading the following detailed description, and upon viewing the accompanying drawings.

DETAILED DESCRIPTION

Figure 1:
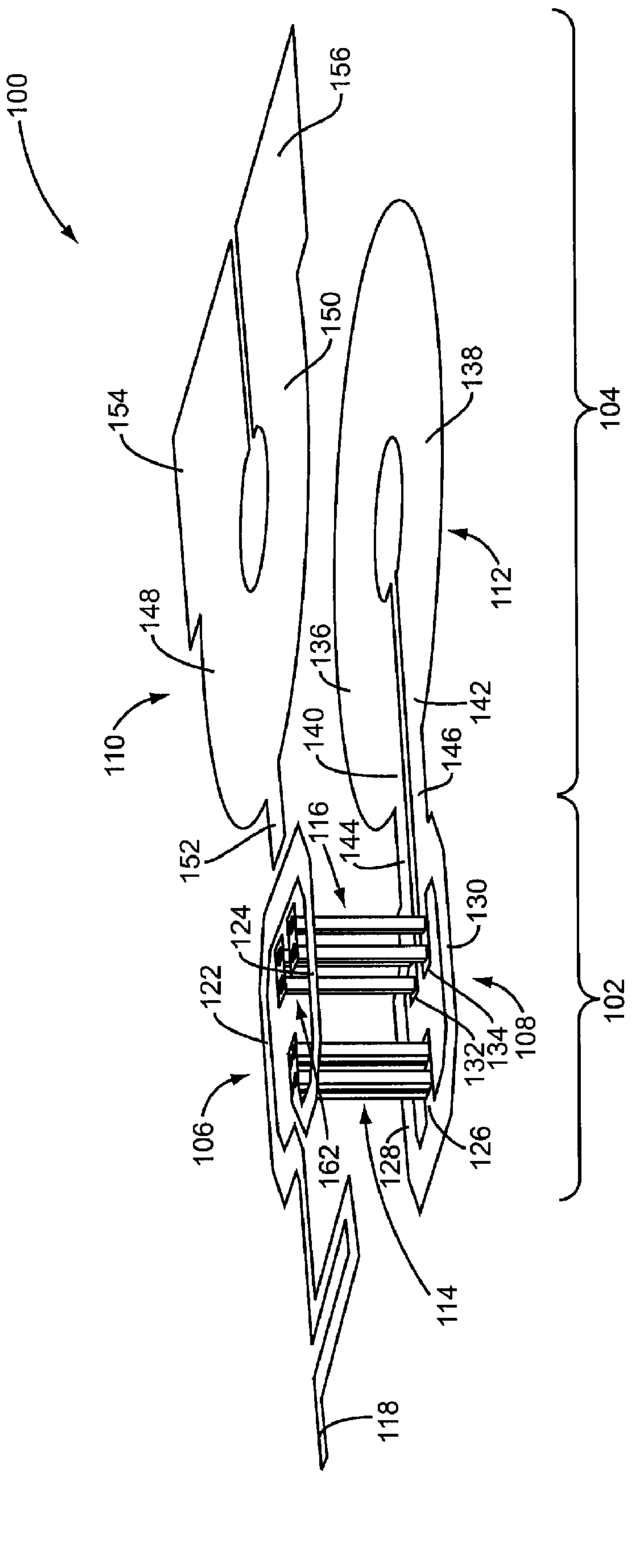
FIG. 1 is a multi-layer view of an embodiment of a multistage balun with broadside-coupled stripline transformers.
Figure 2:
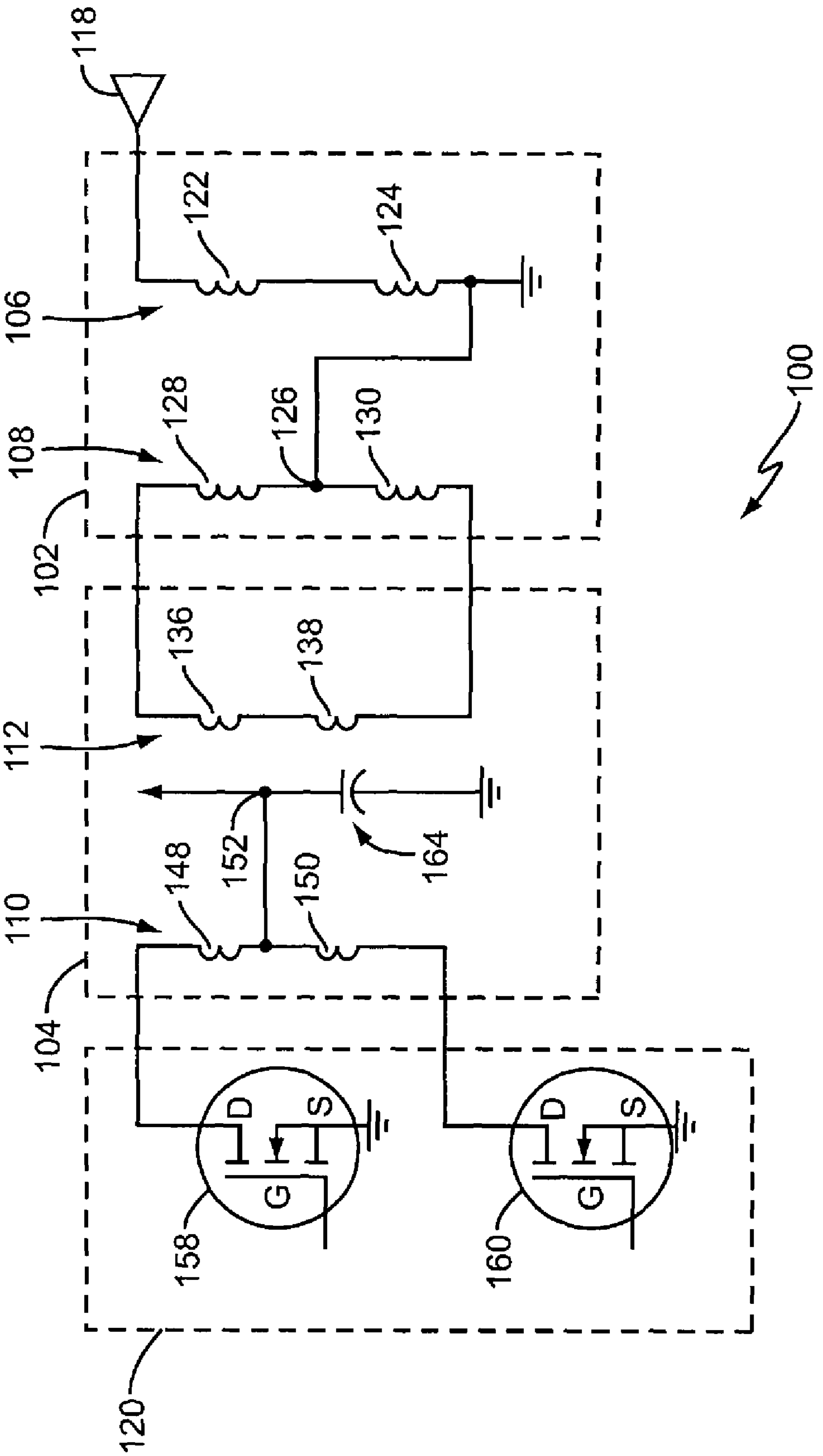
FIG. 2 is an equivalent circuit diagram of the multistage balun of FIG. 1.
Figure 3:
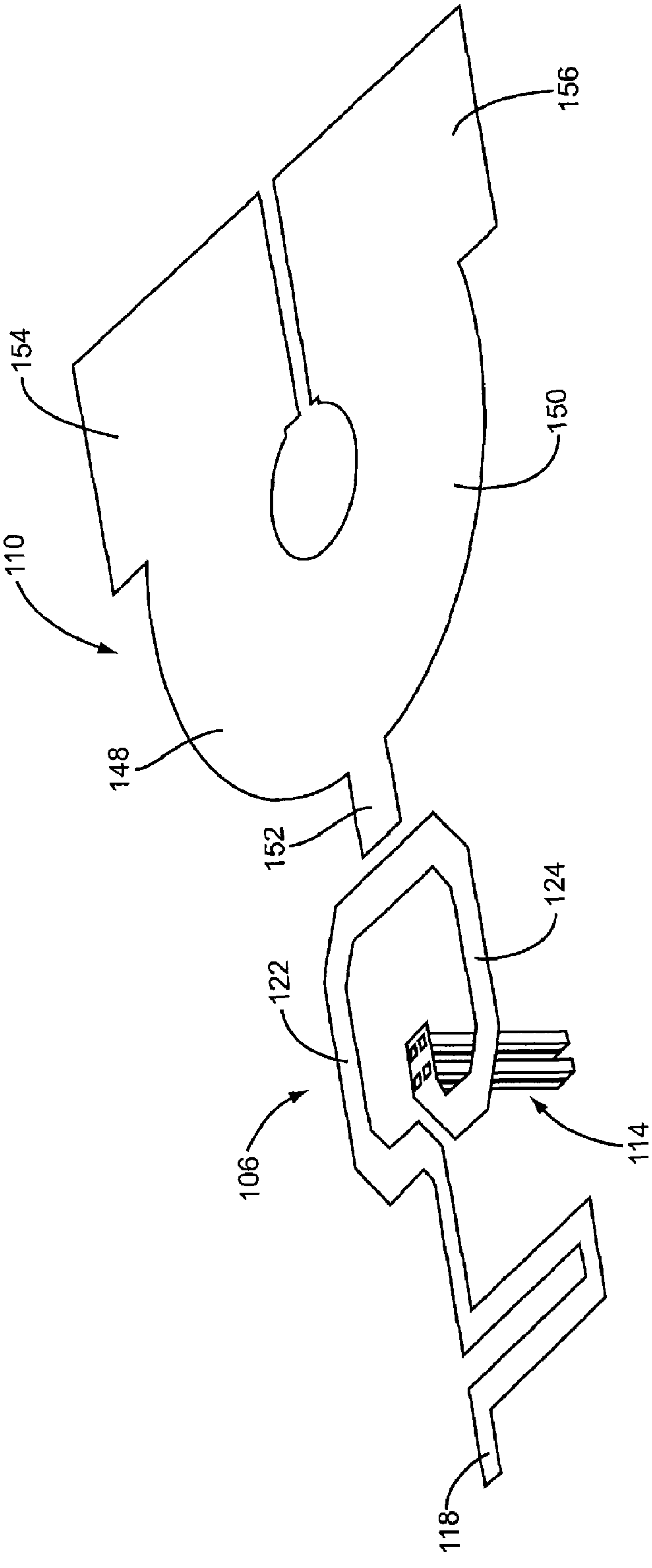
FIG. 3 is a plan view of upper stripline regions of the broadside-coupled stripline transformers of FIG. 1.
Figure 4:
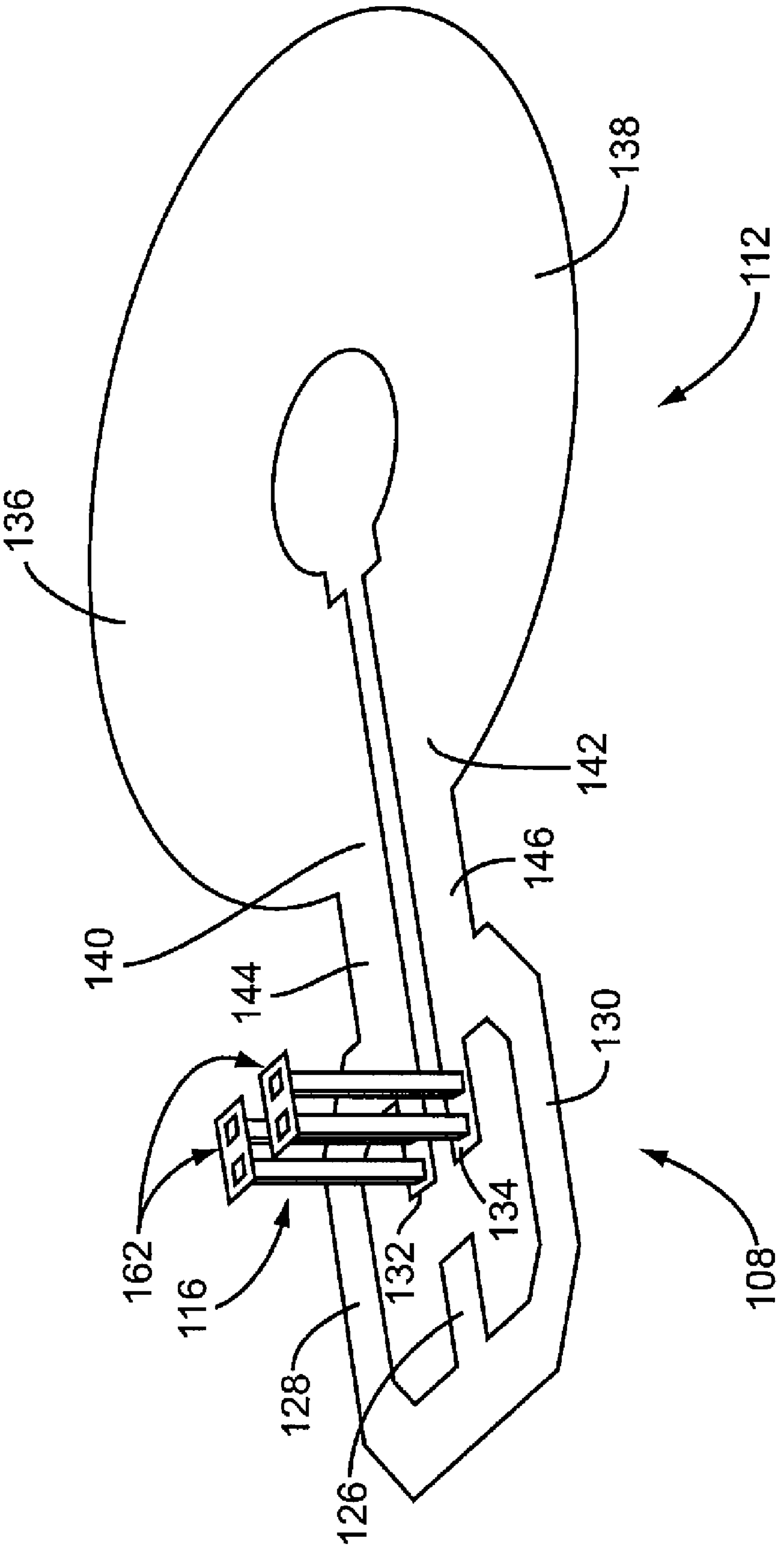
FIG. 4 is a plan view of lower stripline regions of the broadside-coupled stripline transformers of FIG. 1.

FIG. 1 is a three-dimensional view of an embodiment of a balun 100. The equivalent circuit diagram of the balun 100 is shown in FIG. 2. In one embodiment, the balun 100 includes at least two transformers 102, 104. In another embodiment, the balun 100 includes just the second transformer 104 which has a center tap region 152 for providing a central DC feed path, impedance shuffling and signal splitting as described in more detail later herein. Returning to the multistage embodiment, the first transformer 102 includes a broadside-coupled stripline structure having an upper conductive stripline 106 spaced apart from a lower conductive stripline 108. The upper and lower striplines 106, 108 are electromagnetically coupled together during operation of the balun 100. The second transformer 104 also includes a broadside-coupled stripline structure having upper and lower spaced-apart conductive striplines 110, 112 electromagnetically coupled together during operation of the balun 100. The striplines 106-112 comprise relatively flat strips of metal which can be arranged between two ground planes (not shown), e.g., a bottom ground plane and a top ground plane. FIG. 3 shows the upper striplines 106, 110 of both transformers 102, 104 formed in one plane and FIG. 4 shows the lower striplines 108, 112 of both transformers 102, 104 formed in a different plane. In one embodiment, the upper and lower striplines 106-112 are formed in two or more different planes of a multi-layer PCB (not shown). Conductive vias 114 can be used to connect the upper and lower striplines 106, 108 of the first transformer 102 in a particular configuration as described in more detail later. Additional conductive vias 116 can be provided for coupling one or more non-DC blocking capacitors (not shown) to the balun 100. In another embodiment, the upper and lower striplines 106-112 of the balun 100 are formed in different single-layer PCBs (not shown) which are connected together.

The balun 100 connects an unbalanced (i.e., single-ended) line 118 to a power transistor device 120 having a balanced output as schematically shown in FIG. 2. Particularly, the upper stripline 106 of the first transformer 102 is coupled to the unbalanced line 118. In an embodiment, the upper stripline 106 of the first transformer 102 has two branches 122, 124 coupled in series. Both branches 122, 124 of the upper stripline 106 taken together represent the high impedance side of the first transformer 102 and have a total electrical length of approximately ½ λ. The first branch 122 couples the unbalanced line 118 to the second branch 124 which is tied to ground as shown in FIG. 2. The end of the second branch 124 tied to ground is also directly coupled to a center tap region 126 of the lower stripline 108 of the first transformer 102 meaning that the second upper branch 124 provides both AC signal information and DC bias to the center tap region 126 of the lower stripling 108. According to this embodiment, the lower stripline 108 of the first transformer 102 also has two branches 128, 130. The branches 128, 130 of the lower stripline 108 are relatively symmetric and extend from the center tap region 126 to opposing end regions 132, 134. Each branch 128, 130 of the lower stripline 108 has an electrical length of approximately ¼λ and taken together represent the low impedance side of the first transformer 102.

Connecting the grounded end of the upper stripline 106 of the first transformer 102 to the center tap region 126 of the underlying lower stripline 108 enables the first transformer 102 to convert a single-ended (unbalanced) signal carried by the upper stripline 106 to a differential (balanced) signal in the lower stripline 108 or vice-versa. Each branch 128, 130 of the lower stripline 108 carries a signal approximately 180° out of phase with the signal carried by the other symmetric branch. Each branch 128, 130 of the lower stripline 108 of the first transformer 102 is directly coupled to a corresponding branch 136, 138 of the lower stripline 112 of the second transformer 104. Accordingly, no DC blocking capacitors are used to connect the transformers 102, 104 of the balun 100.

In one embodiment, the lower striplines 108, 112 of the transformers 102, 104 have first ends 132, 140 directly coupled to each other by a first conductive stripline 144 and second ends 134, 142 directly coupled to each other by a second conductive stripline 146. The lower stripline 112 of the second transformer 104 represents the high impedance side of the second transformer 104 and the upper stripline 110 of the second transformer 104 represents the low impedance side. The lower stripline 112 of the second transformer 104 has two branches 136, 138 which together have a total electrical length of approximately ½ λ. During operation, a differential signal carried by the lower stripline 112 of the second transformer 104 is electromagnetically coupled to the upper stripline 110 of the second transformer 104 or vice-versa.

In one embodiment, the upper stripline 110 of the second transformer 104 is generally omega shaped as shown in FIGS. 1 and 3. According to this embodiment, two conductive and generally symmetric stripline branches 148, 150 extend from a center tap region 152 of the upper stripline 110 to respective spaced-apart end regions 154, 156. In one embodiment, each end region 154, 156 of the omega-shaped upper stripline 100 is connected to a different drain (D) of the power transistor device 120 as shown in FIG. 2. According to this embodiment, the power device includes a pair of power transistors 158, 160. The drain (D) of each power transistor 158, 160 is coupled to a respective end 154, 156 of the upper stripline 110 of the second transformer 104. The power transistor sources (S) are tied to ground and gates (G) to respective inputs.

Coupling the power transistor device 120 to the unbalanced line 118 using the balun 100 eliminates the need for DC blocking capacitors. Instead, the lower striplines 108, 112 of the transformers 102, 104 are directly coupled to each other as described above. Accordingly, the power transistor device 120 is electromagnetically coupled to the unbalanced line 118. The power device 120 can be used in relatively high power applications (e.g., 300 W and above) because there are no DC blocking capacitors subject to excessive heating. Moreover, the broadside-coupled stripline transformers 102, 104 reliably operate in the microwave frequency range (300 MHz and above). Simulation has shown balun operating frequencies in excess of 2 GHz. In addition, the broadside-coupled stripline transformers 102, 104 provide an impedance transformation between the power transistor device 120 and the unbalanced line 118 of approximately 30:1 or greater at microwave frequencies. The balun 100 also has a bandwidth of approximately 60% or better at microwave operating frequencies (e.g., a bandwidth of approximately 400 MHz or greater). Accordingly, the balun 100 is well suited for applications having high frequency, bandwidth and power requirements such as COFDM video. The balun 100 can be used in other applications as well.

Non-DC blocking capacitors can be added at different sections of the balun 100 to improve the operating characteristics of the balun 100. In one embodiment, tuning capacitors (not shown) are coupled to the common connection point between the lower striplines 108, 112 of the transformers 102, 104. Particularly, one or more conductive vias 116 can extend from the end 132, 134 of each respective branch 128, 130 of the lower stripline 108 to a capacitor connection region 162 as shown in FIGS. 1 and 4. Connecting tuning capacitors to the capacitor connection region 162 extends the length of the low impedance side of the first transformer 102 for tuning and impedance matching.

In another embodiment, a capacitor 164 is coupled between ground and the center tap region 152 of the upper stripline 110 of the second transformer 104 as shown in FIG. 2. This capacitor 164 RF grounds the center tap region 152 of the upper stripline 110 of the second transformer 104. RF grounding the center tap region 152 in this way enables baseband filtering with a very high cutoff frequency. RF grounding the center tap region 152 also allows for DC power to be centrally fed to the power transistor device 120 through the center tap region 152 instead of a single-sided feed path. DC power can be applied to the drain of each power transistor 158, 160 through the respective branches 148, 150 of the upper stripline 110 of the second transformer 104 when the center tap region 152 of the upper stripline 110 is capacitively coupled to ground. The DC power applied to the RF grounded center tap region 152 is fed to the drains of the power transistor 158, 160 via the symmetric branches 148, 150 of the upper stripline 100 of the second transformer 104 which are each approximately ¼ λ wavelength. Thus, both sides of the power transistor drain are terminated approximately at the same wavelength. Moreover, both sides of the power transistor drain are relatively evenly matched when the upper stripline 110 of the second transformer 104 is generally omega-shaped as described above because each point on one drain terminal has approximately the same distance to the center tap region 152 as the same point on the other drain terminal as will be described in more detail later herein. According to one embodiment, the balun 100 includes only the second generally omega-shaped transformer 104 for providing a central DC feed path to the power transistor device 120 or any other type of suitable device. The second broadside-coupled stripline transformer 104 can be of any suitable configuration, shape and/or dimension. For example, the vertical orientation of the striplines 110, 112 of the second transformer 104 can be flipped depending on the type of application.

Figure 5:
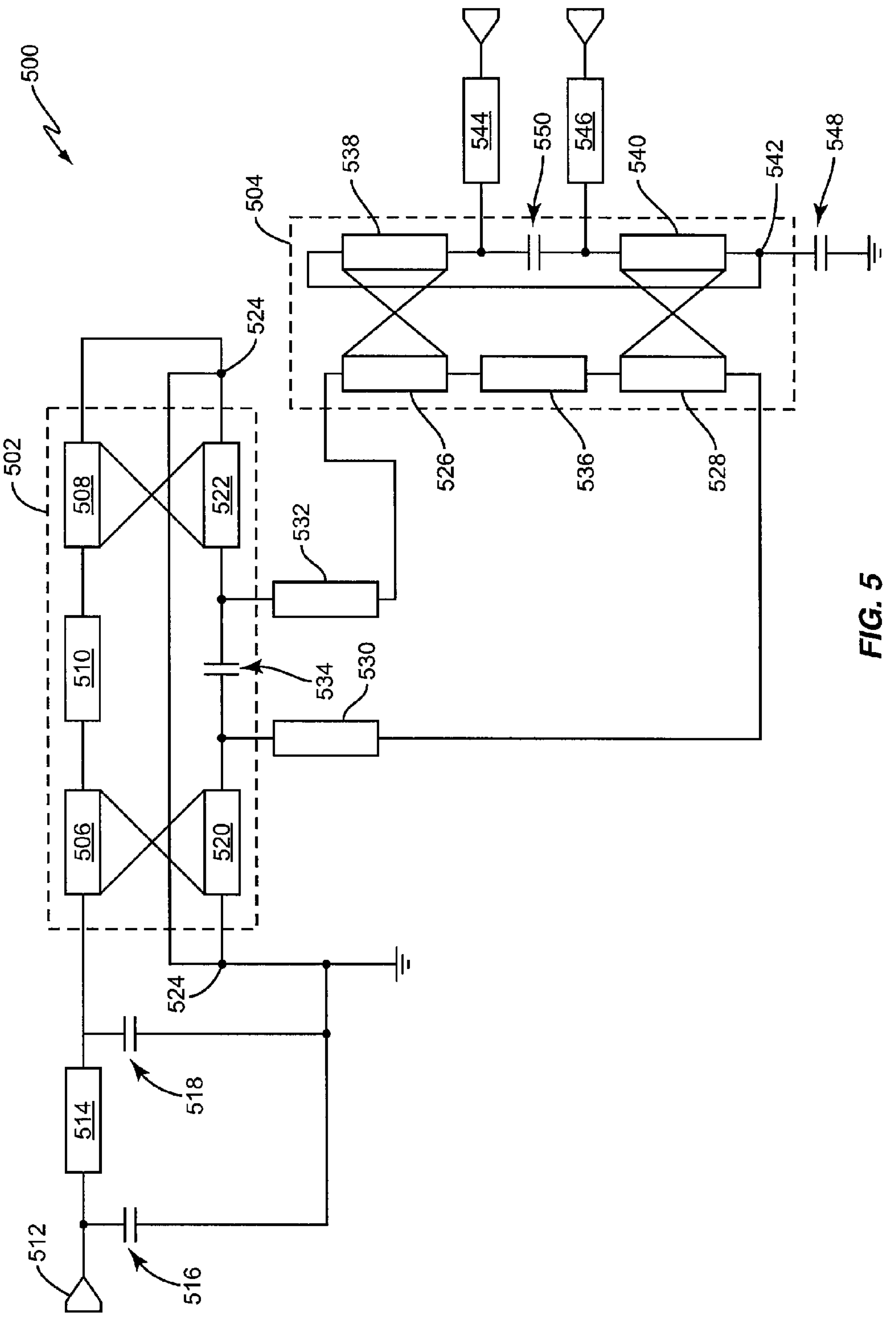
FIG. 5 is a circuit schematic of an embodiment of a multistage balun with broadside-coupled stripline transformers.

FIG. 5 illustrates a circuit schematic of a balun 500 with two broadside-coupled stripline transformers 502, 504 directly coupled together. However, any number of transformers can be used depending on the type of application. An upper stripline of the first transformer 502 is formed by first and second conductive branches 506, 508 coupled in series by a conductor 510. The first branch 506 of the upper stripline is directly coupled to a single-ended (unbalanced) line 512 through a conductor 514 which can be capacitively coupled to ground via one or more chip capacitors 516, 518. The second branch 508 of the upper stripline is tied to ground and directly coupled to a lower stripline of the first transformer 502. The lower stripline of the first transformer 502 is formed by first and second conductive branches 520, 522 joined together at a center tap region 524. The center tap region 524 is where the second branch 508 of the upper stripline connects to the lower stripline. This arrangement allows for single-ended to differential signal conversion as previously described herein. Each branch 520, 522 of the lower stripline of the first transformer 502 is directly coupled to a corresponding branch 526, 528 of a lower stripline of the second transformer 504. In one embodiment, the lower stripline branches 520/528, 522/526 are directly coupled together through respective conductors 530, 532. A tuning capacitor 534 can also be coupled between the ends of the branches 520, 522 of the lower stripline of the first transformer 502.

The lower stripline branches 526, 528 of the second transformer 504 are directly coupled together at a center tap region 536. Each lower stripline branch 526, 528 of the second transformer 504 is electromagnetically coupled to a corresponding branch 538, 540 of an upper stripline of the second transformer 504 during operation of the balun 500. The upper stripline branches 538, 540 of the second transformer 504 are also directly coupled together at a center tap region 542 and extend to respective conductive signal lines 544, 546. The center tap region 542 of the upper stripline of the second transformer 504 can be coupled to ground by a capacitor 548, RF grounding the center tap region 542. The RF grounded center tap region 542 provides a common DC bias feed point. The ends of the upper stripline branches 538, 540 of the second transformer 504 can be coupled together by a tuning capacitor 550. Additional non-DC blocking capacitors (not shown) can be coupled to the balun 500 depending on the type of application. Also, the broadside-coupled stripline transformers 502, 504 can be of any suitable configuration, shape and/or dimension. For example, the respective upper and lower striplines 106/108, 110/112 discussed previously herein can be flipped in orientation and/or be of a different shape, size, dimension, etc. Broadly, the balun 500 with the broadside-coupled stripline transformers 502, 504 can be used to electromagnetically couple a power transistor device to an unbalanced line 512 without using DC blocking capacitors.

Figure 6:
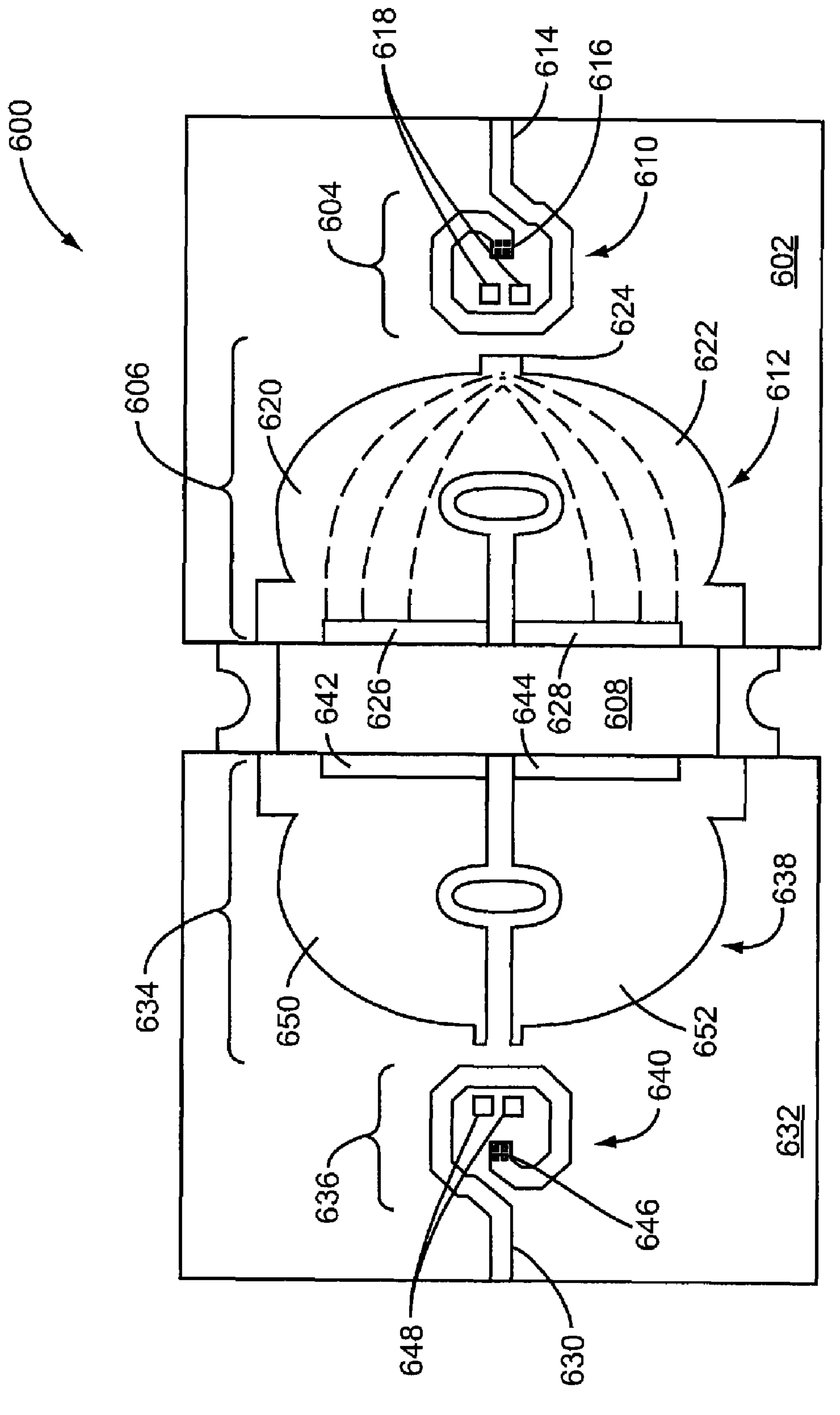
FIG. 6 is a plan view of an embodiment of an assembly including a power transistor device coupled to at least one multistage balun.
Figure 7:
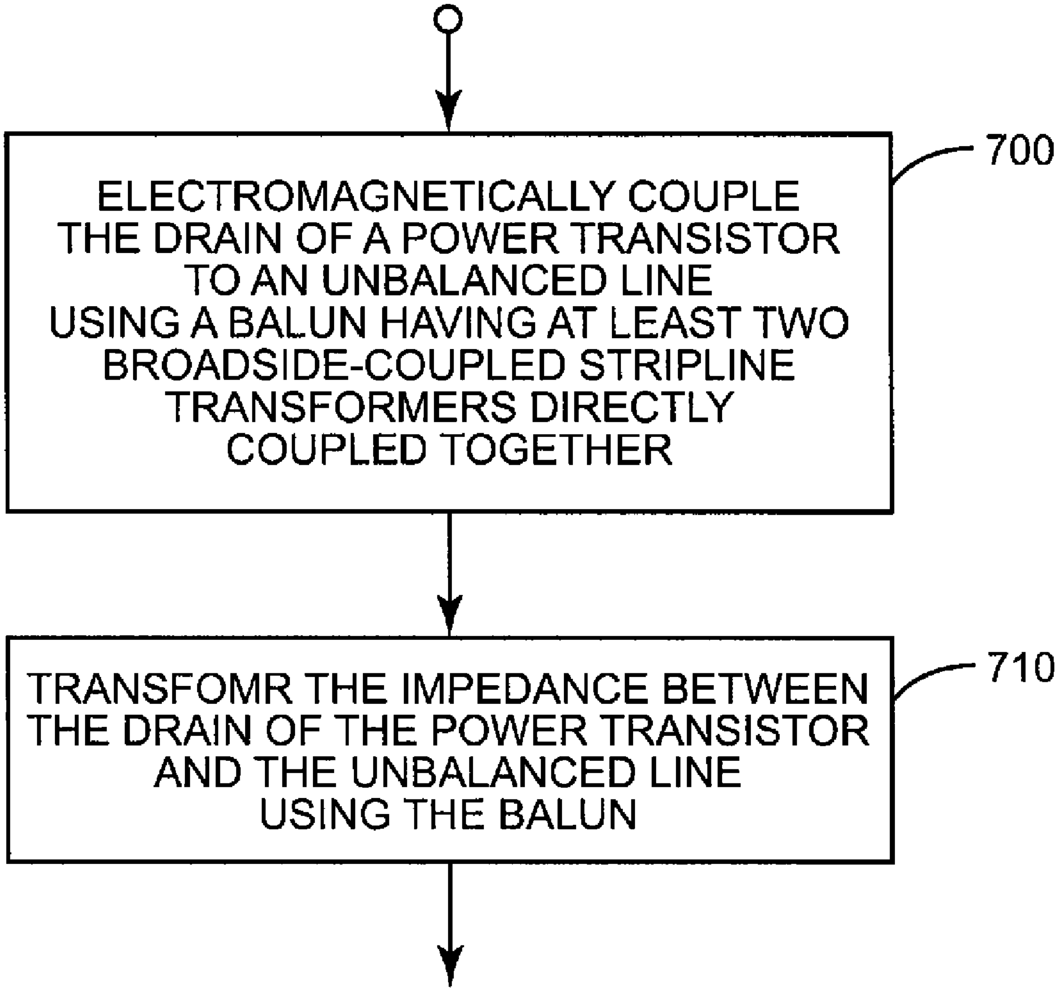
FIG. 7 is a flow diagram of an embodiment of a method for connecting a multistage balun to a device.

FIG. 6 illustrates an embodiment of a subassembly 600 including a balun 602 with two broadside-coupled stripline transformers 604, 606 coupled to the output of a power transistor device 608. Again, any number of transformers can be used depending on the type of application. The broadside-coupled stripline transformers 604, 606 are directly coupled together as previously explained herein. FIG. 6 is a plan view of the subassembly, so only the upper stripline regions 610, 612 of the transformers 604, 606 are visible. The balun 602 electromagnetically couples the drain of the power transistor device 608 to an unbalanced line 614 without using DC blocking capacitors, e.g., as illustrated by Step 700 of FIG. 7. The balun 602 also transforms the impedance between the drain of the power transistor device 608 and the unbalanced line 614, e.g., as illustrated, e.g., as illustrated by Step 710 of FIG. 7.

In more detail, the unbalanced line 614 is coupled to the upper stripline 610 of the first transformer 604. The other end of the upper stripline 610 is coupled to an underlying stripline (out of view) at a center tap region of the lower stripline by one or more conductive vias 616. The lower stripline of the first transformer 604 is directly connected to a lower stripline (out of view) of the second transformer 606. The ends of the lower stripline branches can be coupled to one or more tuning capacitors (not shown) at a capacitor contact region 618. The lower stripline of the second transformer 606 is electromagnetically coupled to the overlying stripline 612 of the second transformer 606. Branches 620, 622 of the upper stripline 612 of the second transformer 606 extend from a center tap region 624 to different drain terminals 626, 628 of the power transistor device 608. In one embodiment, the upper stripline 612 of the second transformer 606 is generally omega-shaped as shown in FIG. 6 so that each point on one drain terminal 626/628 is approximately the same distance to the center tap region 624 as the same point on the other drain terminal 628/626 as indicated by the dashed lines in FIG. 6.

In one embodiment, the center tap region 624 of the upper stripline 612 of the second transformer 606 is capacitively coupled to ground so that a DC power feed can be evenly applied to the power transistor device 608 through the center tap region 624 while the center tap 624 is RF grounded. Moreover, the branches 620, 622 of the upper stripline 612 of the second transformer 606 are generally symmetric. Accordingly, the DC feed path to the drain terminals 626, 628 of the power transistor device 608 has near equal distribution across the drain terminals 626, 628. This in turn provides relatively even impedance matching and termination across the drain terminals 626, 628 at fundamental, $2^{nd}$ harmonic and baseband frequencies. The upper stripline 612 of the second transformer 606 can be made relatively wide as shown in FIG. 6 so that the inductance between the DC feed point at the center tap region 624 and the drain terminals 626, 628 is low, reducing L di/dt induced voltage peaks which occur in certain applications such as COFDM video. The low inductance at the drain terminals 626, 628 also increases operating bandwidth which is important for certain applications such as video. Bandwidth increases because the cutoff frequency of the baseband termination is substantially increased which is ideal for certain push-pull applications. In some simulations, a bandwidth of 60% or greater have been achieved at microwave frequencies. This is in addition to an impedance transformation ratio of 30:1 or greater at microwave frequencies. Electromagnetically coupling the power transistor device 608 to the unbalanced line 614 using the balun 602 also decreases low-frequency parasitic gain spikes which can be problematic unless filtered or otherwise attenuated.

The input (gate) side of the power transistor device 608 can be similarly coupled to an unbalanced input line 630 using a second balun 632. The balun 632 on the input side of the power device 608 also includes at least two broadside-coupled stripline transformers 634, 636 directly coupled together. Again, because FIG. 6 is a plan view of the subassembly, only the upper stripline regions 638, 640 of the second balun 632 are shown. In more detail, the third broadside-coupled stripline transformer 634 includes an upper stripline 638 coupled to different gate terminals 642, 644 of the power transistor device 608 and a lower stripline (out of view) spaced apart from and underlying the upper stripline 638. The fourth broadside-coupled stripline transformer 636 also has an upper stripline 640 spaced apart from and overlying a lower stripline (out of view). The upper stripline 640 of the fourth transformer 636 is coupled to the unbalanced input line 630 and to a center tap region (out of view) of the underlying lower stripline by one or more conductive vias 646. The lower striplines of the third and fourth transformers 634, 636 are directly coupled to each other as described herein so that DC blocking capacitors are not needed at the input side of the power transistor device 608. One or more tuning capacitors (not shown) can be coupled to the connection point between the lower striplines of the third and fourth transformers 634, 636 at a capacitor contact region 648. In one embodiment, the upper stripline 638 of the third transformer 634 includes two physically separate branches 650, 652 which do not share a common center tap region so that the gate terminals 642, 644 can be DC isolated from each other. Common RLC components have been excluded from FIG. 6 for ease of illustration and explanation only. However, those skilled in the art will readily recognize that different RLC components can be added to the subassembly 600 depending on the application under consideration.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A balun, comprising:

a first transformer comprising a broadside-coupled stripline structure having a first stripline conductor coupled to an unbalanced line and a second stripline conductor spaced apart from the first stripline conductor; and a second transformer comprising a broadside-coupled stripline structure having a first stripline conductor spaced apart from a second stripline conductor directly coupled to the second stripline conductor of the first transformer, wherein each stripline conductor has an end-to-end electrical length of approximately ½ λ.

2. The balun of claim 1, wherein the first stripline conductor of the second transformer is generally omega shaped.

3. The balun of claim 1, further comprising a capacitor coupled between ground and a center tap region of the first stripline conductor of the second transformer.

4. The balun of claim 1, wherein the second stripline conductors have first ends directly coupled to each other by a first conductive stripline and second ends directly coupled to each other by a second conductive stripline.

5. The balun of claim 1, wherein the first stripline conductor of the first transformer has a first end directly coupled to the unbalanced line and a second end coupled to ground and directly connected to a center tap region of the second stripline conductor of the first transformer.

6. A method of forming a balun, comprising:

providing a first transformer comprising a broadside-coupled stripline structure having a first stripline conductor spaced apart from a second stripline conductor;

providing a second transformer comprising a broadside-coupled stripline structure having a first stripline conductor spaced apart from a second stripline conductor;

coupling the first stripline conductor of the first transformer to an unbalanced line; and directly coupling the second stripline conductor of the second transformer to the second stripline conductor of the first transformer, wherein each stripline conductor has an end-to-end electrical length of approximately ½ λ.

7. The method of claim 6, wherein the first stripline conductor of the second transformer is generally omega shaped.

8. The method of claim 6, further comprising coupling a capacitor between ground and a center tap region of the first stripline conductor of the second transformer.

9. The method of claim 6, comprising:

directly coupling first ends of the second stripline conductors to each other by a first conductive stripline; and directly coupling second ends of the second stripline conductors to each other by a second conductive stripline.

10. The method of claim 6, comprising:

directly coupling a first end of the first stripline conductor of the first transformer to the unbalanced line;

directly connecting a second end of the first stripline conductor of the first transformer to a center tap region of the second stripline conductor of the first transformer; and grounding the center tap region of the second stripline conductor of the first transformer and the second end of the first stripline conductor of the first transformer.

11. A subassembly, comprising:

a power transistor device;

a balun operable to electromagnetically couple a drain of the power transistor device to an unbalanced line and transform an impedance between the drain of the power transistor device and the unbalanced line, the balun comprising at least two broadside-coupled stripline transformers directly coupled together, a first one of the broadside-coupled stripline transformers comprising a first stripline conductor coupled to the drain of the power transistor device and a second stripline conductor spaced apart from the first stripline conductor, a second one of the broadside-coupled stripline transformers comprising a first stripline conductor coupled to the unbalanced line and a second stripline conductor spaced apart from the first stripline conductor and directly coupled to the second stripline conductor of the first broadside-coupled stripline transformer; and a capacitor coupled between ground and a center tap region of the first stripline conductor of the second broadside-coupled stripline transformer.

12. The subassembly of claim 11, wherein the first stripline conductor of the first broadside-coupled stripline transformer is generally omega shaped.

13. The subassembly of claim 11, further comprising:

a third broadside-coupled stripline transformer comprising a first stripline conductor coupled to a gate of the power transistor device and a second stripline conductor spaced apart from the first stripline conductor; and a fourth broadside-coupled stripline transformer comprising a first stripline conductor coupled to a second unbalanced line and a second stripline conductor spaced apart from the first stripline conductor and directly coupled to the second stripline conductor of the third broadside-coupled stripline transformer.

14. The subassembly of claim 13, wherein the first stripline conductor of the third broadside-coupled stripline transformer comprises first and second spaced apart and generally symmetric branches, the first branch being directly coupled to a first gate terminal of the power transistor device and the second branch being directly coupled to a second gate terminal of the power transistor device.

15. A subassembly, comprising:

a power transistor device;

a balun operable to electromagnetically couple a drain of the power transistor device to an unbalanced line and transform an impedance between the drain of the power transistor device and the unbalanced line, the balun comprising at least two broadside-coupled stripline transformers directly coupled together, a first one of the broadside-coupled stripline transformers comprising a first stripline conductor coupled to the drain of the power transistor device and a second stripline conductor spaced apart from the first stripline conductor, a second one of the broadside-coupled stripline transformers comprising a first stripline conductor coupled to the unbalanced line and a second stripline conductor spaced apart from the first stripline conductor and directly coupled to the second stripline conductor of the first broadside-coupled stripline transformer; and wherein the first stripline conductor of the first broadside-coupled stripline transformer comprises a center tap region and first and second generally symmetric branches, the first branch configured to directly couple the center tap region to a first drain terminal of the power transistor device and the second branch configured to directly couple the center tap region to a second drain terminal of the power transistor device.

16. The subassembly of claim 15, wherein each branch has an electrical length of approximately ¼ λ.

17. The subassembly of claim 15, wherein the center tap region is capacitively coupled to ground and configured to apply DC power to the first and second drain terminals of the power transistor device through the respective branches.

18. The subassembly of claim 15, wherein the first stripline conductor of the first broadside-coupled stripline transformer is generally omega shaped.

19. The subassembly of claim 15, further comprising:

a third broadside-coupled stripline transformer comprising a first stripline conductor coupled to a gate of the power transistor device and a second stripline conductor spaced apart from the first stripline conductor; and a fourth broadside-coupled stripline transformer comprising a first stripline conductor coupled to a second unbalanced line and a second stripline conductor spaced apart from the first stripline conductor and directly coupled to the second stripline conductor of the third broadside-coupled stripline transformer.

20. The subassembly of claim 19, wherein the first stripline conductor of the third broadside-coupled stripline transformer comprises first and second spaced apart and generally symmetric branches, the first branch being directly coupled to a first gate terminal of the power transistor device and the second branch being directly coupled to a second gate terminal of the power transistor device.

21. A subassembly, comprising:

a power transistor device; and a balun operable to electromagnetically couple a drain of the power transistor device to an unbalanced line and transform an impedance between the drain of the power transistor device and the unbalanced line, the balun comprising at least two broadside-coupled stripline transformers directly coupled together, the balun being further operable to transform the impedance between the drain of the power transistor device and the unbalanced line by at least 30:1 at microwave frequencies.

22. A method of connecting a balun to a device, comprising:

providing a power transistor device;

electromagnetically coupling a drain of the power transistor device to an unbalanced line via a balun comprising at least two broadside-coupled stripline transformers directly coupled together; and transforming an impedance between the drain of the power transistor device and the unbalanced line by at least 30:1 at microwave frequencies via the balun.

23. The method of claim 22, comprising:

coupling a first stripline conductor of a first one of the broadside-coupled stripline transformers to the drain of the power transistor device;

coupling a first stripline conductor of a second one of the broadside-coupled stripline transformers to the unbalanced line; and directly coupling together second strip line conductors of the first and second broadside-coupled stripline transformers.

24. The method of claim 23, wherein the first stripline conductor of the first broadside-coupled stripline transformer comprises a center tap region and first and second generally symmetric branches, the first branch directly coupling the center tap region to a first drain terminal of the power transistor device and the second branch directly coupling the center tap region to a second drain terminal of the power transistor device.

25. The method of claim 24, comprising:

capacitively coupling the center tap region to ground; and applying DC power to the first and second drain terminals of the power transistor device through the center tap region and respective branches.

26. The method of claim 23, further comprising:

coupling a first stripline conductor of a third broadside-coupled stripline transformer to a gate of the power transistor device;

coupling a first stripline conductor of a fourth broadside-coupled stripline transformer to a second unbalanced line; and directly coupling together second stripline conductors of the third and fourth broadside-coupled stripline transformers.

27. A method of connecting a balun to a device, comprising:

providing a power transistor device;

electromagnetically coupling a drain of the power transistor device to an unbalanced line via a balun comprising at least two broadside-coupled stripline transformers directly coupled together, including:

coupling a first stripline conductor of a first one of the broadside-coupled stripline transformers to the drain of the power transistor device, the first stripline conductor of the first broadside-coupled stripline transformer comprising a center tap region and first and second generally symmetric branches, the first branch directly coupling the center tap region to a first drain terminal of the power transistor device and the second branch directly coupling the center tap region to a second drain terminal of the power transistor device;

coupling a first stripline conductor of a second one of the broadside-coupled stripline transformers to the unbalanced line;

directly coupling together second strip line conductors of the first and second broadside-coupled stripline transformers;

capacitively coupling the center tap region to ground;

applying DC power to the first and second drain terminals of the power transistor device through the center tap region and respective branches; and transforming an impedance between the drain of the power transistor device and the unbalanced line via the balun.

28. The method of claim 27, further comprising:

coupling a first stripline conductor of a third broadside-coupled stripline transformer to a gate of the power transistor device;

coupling a first stripline conductor of a fourth broadside-coupled stripline transformer to a second unbalanced line; and directly coupling together second stripline conductors of the third and fourth broadside-coupled stripline transformers.

* * * * *